United States Patent
Shin

(10) Patent No.: US 10,304,622 B2
(45) Date of Patent: May 28, 2019

(54) ELECTRONIC COMPONENT

(71) Applicant: SAMSUNG ELECTRO-MECHANICS CO., LTD., Suwon-si, Gyeonggi-do (KR)

(72) Inventor: Sung Sik Shin, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 181 days.

(21) Appl. No.: 15/444,713

(22) Filed: Feb. 28, 2017

(65) Prior Publication Data

US 2018/0033546 A1  Feb. 1, 2018

(30) Foreign Application Priority Data

Jul. 28, 2016 (KR) .................. 10-2016-0096189

(51) Int. Cl.
| | |
|---|---|
| *H01F 27/40* | (2006.01) |
| *H01G 4/012* | (2006.01) |
| *H01G 4/40* | (2006.01) |
| *H01G 4/30* | (2006.01) |
| *H03H 1/00* | (2006.01) |
| *H01F 27/28* | (2006.01) |
| *H01G 4/232* | (2006.01) |
| *H01G 4/12* | (2006.01) |

(52) U.S. Cl.
CPC .......... *H01F 27/40* (2013.01); *H01F 27/2804* (2013.01); *H01G 4/012* (2013.01); *H01G 4/232* (2013.01); *H01G 4/30* (2013.01); *H01G 4/40* (2013.01); *H03H 1/00* (2013.01); *H01F 2027/2809* (2013.01); *H01G 4/1227* (2013.01); *H01G 4/1245* (2013.01); *H03H 2001/0085* (2013.01); *H03H 2001/0092* (2013.01)

(58) Field of Classification Search
CPC ........ H01F 27/40; H01G 4/0005; H01G 4/40; H01G 4/30
USPC .......................................... 361/270
See application file for complete search history.

(56) References Cited

U.S. PATENT DOCUMENTS

| | | | | |
|---|---|---|---|---|
| 2001/0037895 A1* | 11/2001 | Gotoh | .................... | H01G 4/228 174/250 |
| 2009/0121806 A1* | 5/2009 | Sasaki | .................... | H03H 1/00 333/174 |
| 2015/0022937 A1* | 1/2015 | Park | .................... | H01G 4/30 361/270 |

FOREIGN PATENT DOCUMENTS

| | | |
|---|---|---|
| JP | 2004-327885 A | 11/2004 |
| KR | 10-2014-0059956 | 5/2014 |

OTHER PUBLICATIONS

Takafumi, Laminated electronic component and laminated array electronic component; Figures and Specification; WO 2008/007491 ; JP 2008-21752 (Year: 2008).*

* cited by examiner

*Primary Examiner* — Dharti H Patel
(74) *Attorney, Agent, or Firm* — Morgan Lewis & Bockius LLP

(57) ABSTRACT

An electronic component includes: a body containing a ceramic material; and an indication part formed on a surface of the body and including a base region and a marking region formed of a non-conductive paste on a portion of the base region.

13 Claims, 4 Drawing Sheets

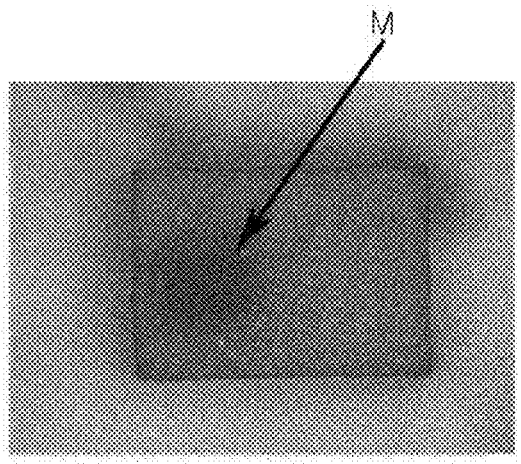
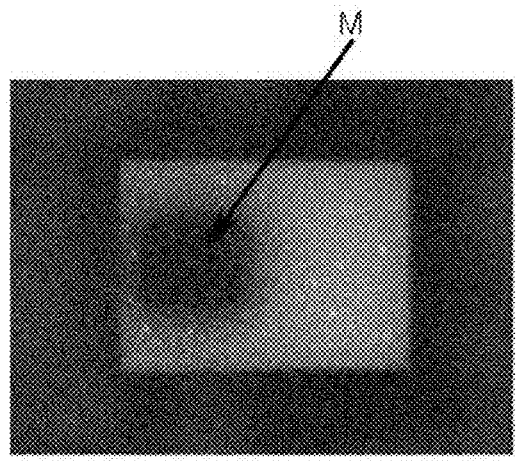
FIG. 5A            FIG. 5B
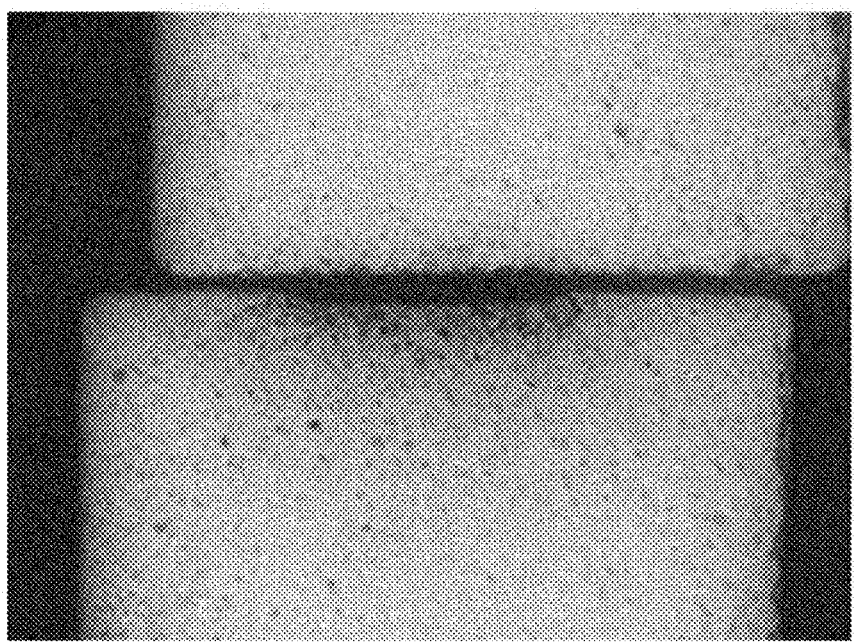
FIG. 6

ELECTRONIC COMPONENT

CROSS-REFERENCE TO RELATED APPLICATION(S)

This application claims the benefit of priority to Korean Patent Application No. 10-2016-0096189, filed on Jul. 28, 2016 in the Korean Intellectual Property Office, the entire disclosure of which is incorporated herein by reference.

BACKGROUND

1. Technical Field

The present disclosure relates to an electronic component.

2. Description of Related Art

Recently, as smartphones, wearable digital devices or the like, have emerged, the demand for miniaturization, multi-functionalization and the like, of electronic components has been increased.

Further, since, among electronic components used in smartphones, wearable digital devices or the like, an LC filter includes various kinds of terminals (such as Signal In, Signal Out, and GND (Ground) terminals), there is a need to distinguish upper and lower portions of the component. To this end, there is increased demand for a marker confirming a directionality of each unit produced in a manufacturing process.

However, in accordance with the recent trend toward miniaturization, multi-functionalization and the like, the size of the electronic component has been generally decreased, and a size of the marker as described above has also been decreased. When the size of the marker has been decreased, it may be difficult to distinguish an indication part, thereby causing problems such as a decrease in a yield of the component, an increase in the manufacturing process time, or the like.

SUMMARY

An aspect of the present disclosure may provide an electronic component including an indication part having excellent distinguishability.

One of the solutions suggested in the present disclosure is to form an indication part having a marking region formed of a non-conductive paste on a surface of a body containing a ceramic material.

For example, according to an aspect of the present disclosure, an electronic component may include: a body containing a ceramic material, and an indication part formed on a surface of the body and including a base region and a marking region formed of a non-conductive paste on a portion of the base region.

BRIEF DESCRIPTION OF THE DRAWINGS

The above and other aspects, features, and advantages of the present disclosure will be more clearly understood from the following detailed description when taken in conjunction with the accompanying drawings, in which:

FIG. 5A is a photograph obtained by observing an exterior of an electronic component after sintering, in a case of forming a marking region M using a non-conductive paste containing a general pigment, and FIG. 5B is a photograph obtained by observing an exterior of an electronic component after sintering, in a case of forming a marking region M using a non-conductive paste containing $(Co,Fe,Mn)(Fe,Mn)_2O_4$ powder; and FIG. 6 is a photograph obtained by observing a cross section of an electronic component after sintering, in a case of forming a marking region M using a non-conductive paste containing 60 wt % of $(Co,Fe,Mn)(Fe,Mn)_2O_4$ powder having a Brunauer-Emmett-Teller adsorption model (BET) of 2.6 $m^2/g$.

DETAILED DESCRIPTION

Hereinafter, exemplary embodiments of the present disclosure will be described in detail with reference to the accompanying drawings.

Hereinafter, an electronic component according to an exemplary embodiment in the present disclosure will be described. For convenience of explanation, an inductor and capacitor (LC) filter will be described by way of example of the electronic component, but the electronic component is not limited thereto. The content of the present disclosure may also be applied in other chip-type electronic components having various purposes. Examples of the chip-type electronic components having various purposes may include inductors, common mode filters, general beads, GHz beads, capacitors, and the like.

Figure 1:
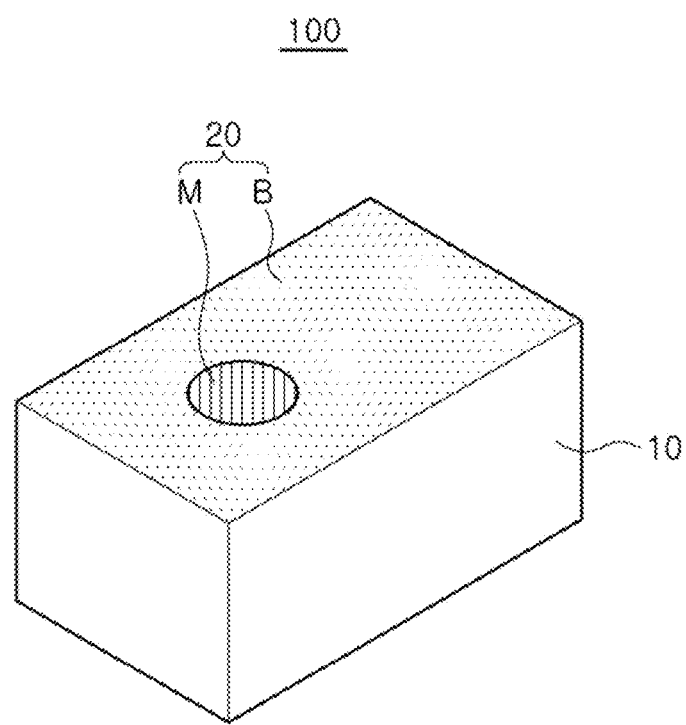
FIG. 1 is a perspective view schematically illustrating an electronic component according to an exemplary embodiment in the present disclosure.
Figure 2:
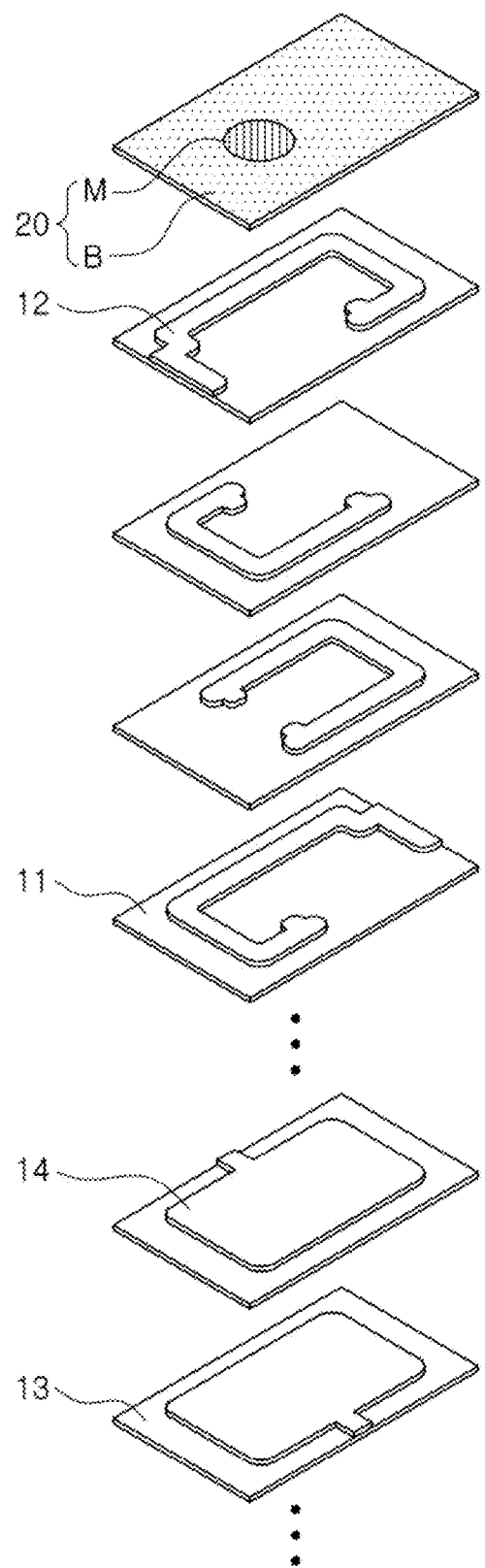
FIG. 2 is an exploded perspective view of the electronic component of FIG. 1.

FIG. 1 is a perspective view schematically illustrating an electronic component according to an exemplary embodiment in the present disclosure; and FIG. 2 is an exploded perspective view schematically illustrating the electronic component of FIG. 1.

Referring to FIGS. 1 and 2, an electronic component 100 includes a body 10 and an indication part 20 formed on a surface of the body 10. In this case, although not illustrated, an external electrode electrically connected to a coil pattern 12 and to an electrode pattern 14, and formed on an outer portion of the body 10 and the like, may be provided, but in the present exemplary embodiment, illustration and description of other configurations except for the body 10 and the indication part 20, corresponding to the main configurations, will be omitted.

The body 10 may contain a ceramic material. According to the exemplary embodiment, the ceramic material may be one or more selected from the group consisting of a $BaTi_4O_9$-based ceramic material, a $BaTiO_3$-based ceramic material, a $BaTiO_3$—$SrTiO_3$-based ceramic material, a $BaTiO_3$—$PbTiO_3$-based ceramic material, a $BaTiO_3$—$CaTiO_3$-based ceramic material, a $BaTiO_3$—$YTiO_3$-based ceramic material, a $BaTiO_3$—$BaSnO_3$-based ceramic material, a $BaTiO_3$—$BaZrO_3$—based ceramic material, and a $PbTiO_3$—$PbZrO_3$-based ceramic material. In this case, characteristics of a product may be improved in accordance with application of a high-permittivity material, but the ceramic material is not necessarily limited thereto.

According to the exemplary embodiment, the body 10 may be obtained by stacking and sintering a plurality of ceramic sheets. In this case, adjacent sheets 11 and 13 may be integrated with each other so that boundaries therebetween are not readily apparent without a scanning electron microscope (SEM), but there is no need to form the adjacent sheets to be integrated with each other as described above. Further, a shape and a dimension of the body 10 are not limited to those illustrated in the present exemplary embodiment, and thicknesses of each of the ceramic sheets 11 and 13 may be optionally changed depending on a capacitance design of the electronic component.

According to the exemplary embodiment, the body 10 may further contain glass. In this case, there is an advantage in that at the time of sintering the ceramic sheet, a sintering temperature may be decreased. Specific examples of the glass may include $SiO_2$—$B_2O_3$—$R_2O$, $SiO_2$—$B_2O_3$—$RO$, $Bi_2O_3$—$B_2O_3$—$ZnO$ and the like, but are not necessarily limited thereto.

The body 10 may include a plurality of coil patterns 12 and electrode patterns 14, and have a structure in which these coil patterns 12 and the electrode patterns 14 are stacked. In order to allow the body 10 to have the structure in which the plurality of coil patterns 12 and electrode patterns 14 are stacked, the body 10 may be obtained by stacking and sintering a plurality of ceramic sheets 11 on which the coil pattern is printed and a plurality of ceramic sheets 13 on which the electrode pattern 14 is printed.

The coil pattern 12 may be formed in a conductive pattern form on the plurality of ceramic sheets 11. For example, the coil pattern 12 may be formed by a method of printing a conductive paste containing a conductive metal on the ceramic sheet 11 or the like. The conductive metal forming the coil pattern 12 is not particularly limited as long as it has excellent electrical conductivity. For example, the conductive metal may be at least one selected from the group consisting of silver (Ag), palladium (Pd), aluminum (Al), nickel (Ni), titanium (Ti), gold (Au), copper (Cu) and platinum (Pt), or an alloy thereof.

The coil pattern 12 may be electrically connected to the coil pattern formed on another layer to form a coil structure, and, although not illustrated, a conductive via penetrating through the ceramic sheet 11 may be provided for interlayer electrical connection as described above.

The electrode pattern 14 may be formed in a metal thin film form on the plurality of ceramic sheets 13. For example, the electrode pattern 14 may be formed by a method of printing a conductive paste containing a conductive metal on the ceramic sheet 13 or the like. The conductive metal forming the electrode pattern 14 is not particularly limited, as long as it has excellent electrical conductivity. For example, the conductive metal may be at least one selected from the group consisting of silver (Ag), palladium (Pd), aluminum (Al), nickel (Ni), titanium (Ti), gold (Au), copper (Cu) and platinum (Pt), or an alloy thereof.

The indication part 20, capable of distinguishing a mounting direction of the electronic component 100, may be formed on a surface of the body 10, and particularly on an upper surface of the body 10, in FIGS. 1 and 2, and the indication part 20 may include a base region B and a marking region M.

Figure 4:
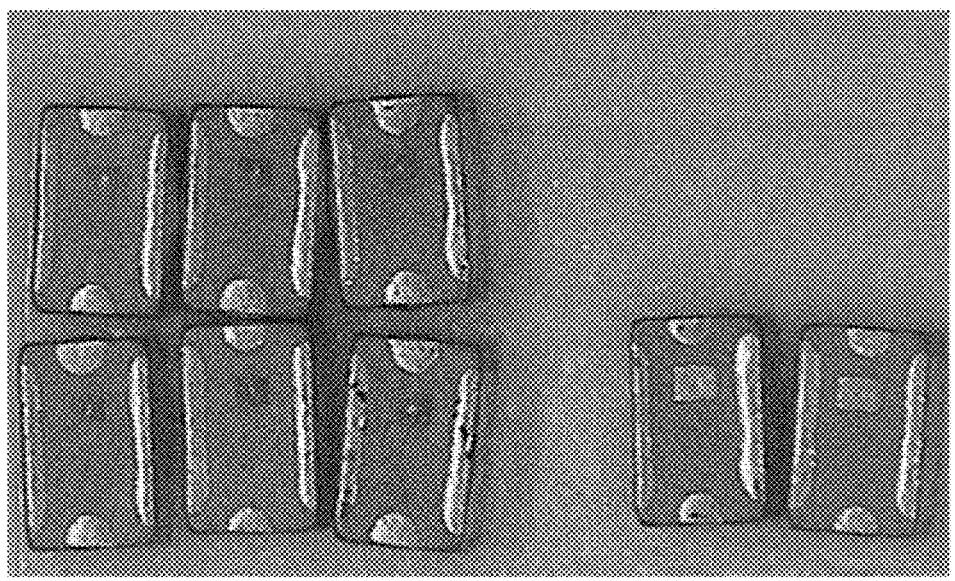
FIG. 4 is a photograph illustrating a comparison of normal products and defective products in which discoloration occurs due to non-plating defect in the related art.

Since various kinds of terminals (such as Signal In, Signal Out, and GND (Ground) terminals) are provided in the electronic components, and particularly in the LC filter, there is a demand for a marker indicating the directionality of the electronic component. Therefore, in an LC filter according to the related art, a marker was implemented by printing an electrode pattern on an upper end of the electronic component, and a GND pattern was positioned below the marker, in order to prevent electrical characteristics caused by the marker from affecting the electronic component. However, in accordance with the recent trend toward the miniaturization of the electronic components, it may be difficult to position a GND pattern in a body, in the case of the use of a configuration of an internal active circuit for implementing characteristics of the LC filter, due to insufficient available space. However, in a case in which the marker is implemented by an electrode pattern without the GND pattern, a possibility that discoloration will occur due to non-plating defect may be increased, and deterioration of the electrical characteristics, such as an increase in insertion loss value due to an influence of parasitic capacitance with the internal active circuit, or the like, may occur. FIG. 4 is a photograph illustrating a comparison of normal products and defective products in the related art, in which discoloration occurs due to non-plating defect. Two products, positioned on a right side in FIG. 4, correspond to normal products, and six products, positioned on a left side, correspond to defective products.

Therefore, according to the exemplary embodiment in the present disclosure, the marking region M may be formed on a portion of the base region B using a non-conductive paste, and thus the distinguishability of the indication part marked on the surface may be significantly improved without the deterioration of electrical characteristics.

The marking region M may have a color darker than that of the base region B, and, for example, the marking region M may have a black color. In this case, excellent distinguishability may be provided due to complementary contrast between a white color of the base region B and a black color of the marking region M. The base region B may contain the same material as the ceramic material contained in the body 10. In this case, the base region B may be stacked together with the plurality of the ceramic sheets 11 and 13 to thereby form a structure integrated with the body 10.

Figure 3:
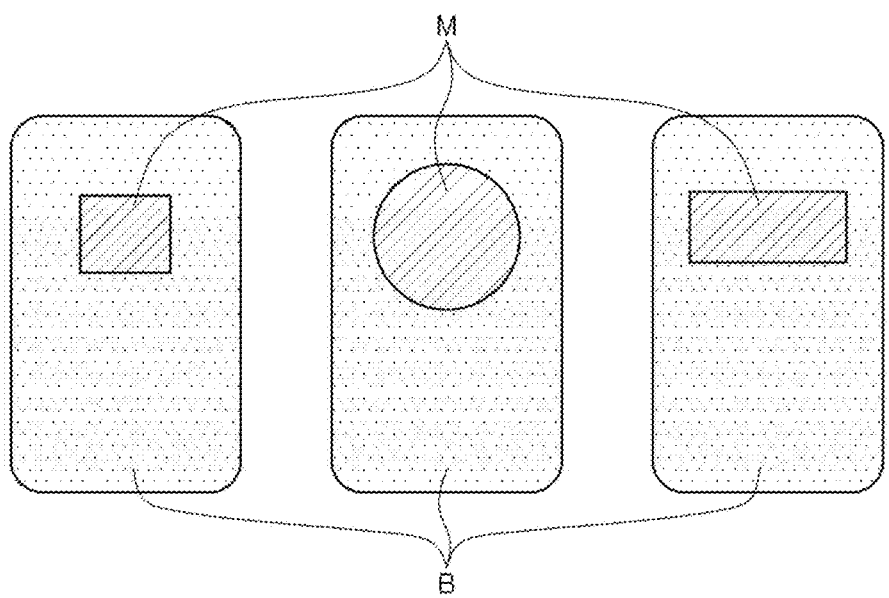
FIG. 3 illustrates various examples of an indication part.

A shape of the indication part 20, that is, the marking region M and the base region B, may be variously changed depending on a size or a shape of the electronic component, a distinguishing method, or the like, as illustrated in FIG. 3. In addition, if necessary, the indication part 20 may have another shape instead of one of the shapes illustrated in FIG. 3.

In a case of the ceramic material, a reduction atmosphere may be locally formed during the sintering, and thus a color of a pigment contained in the non-conductive paste may be changed. According to the exemplary embodiment in the present disclosure, the non-conductive paste may contain a powder formed of one or more selected from the group consisting of (Co,Fe,Mn) (Fe,Mn)$_2$O$_4$, (Co,Fe,Mn) (Fe,Mn,Cr)$_2$O$_4$, (Co,Ni,Fe,Mn) (Fe,Mn,Cr)$_2$O$_4$, (Fe,Cr)$_2$O$_3$, ZnFe$_2$O$_4$, (Ti,Sb,Cr)O$_2$, and CoAl$_2$O$_4$, as the pigment. In this case, even though the non-conductive paste is sintered, a change in color of the marking region M may be significantly decreased. FIG. 5A is a photograph obtained by observing an exterior of an electronic component after sintering, in a case of forming a marking region M using a non-conductive paste containing a general pigment, and FIG. 5B is a photograph obtained by observing an exterior of an electronic component after sintering, in a case of forming a marking region M using a non-conductive paste containing a (Co,Fe,Mn) (Fe,Mn)$_2$O$_4$ powder.

In general, a surface of the body 10 obtained by stacking and sintering the plurality of ceramic sheets is polished before the body 10 is applied to a final product. However, the pigment printed on the indication part 20 may be removed by the polishing as described above. Therefore, it is preferable that the pigment printed on the indication part 20 is diffused into the ceramic material during the sintering, and the present inventors researched the matter in order to see how to diffuse the pigment into the ceramic material most easily, and found that the pigment may be diffused into the ceramic material by controlling a surface area of the pigment. That is, according to the exemplary embodiment in the present disclosure, the powder may have a BET of 1.4 $m^2/g$ or more. In this case, even though the pigment positioned on the surface of the indication part 20 is removed by polishing the surface, distinguishability of the indication part 20 marked on the surface may be maintained by the pigment diffused into the ceramic material. FIG. 6 is a photograph obtained by observing a cross section of an electronic component after sintering, in a case of forming a marking region M using a non-conductive paste containing 60 wt % of the (Co,Fe,Mn) (Fe,Mn)$_2$O$_4$ powder having a BET of 2.6 $m^2/g$. Referring to FIG. 6, it may be confirmed that the pigment printed on the indication part 20 is diffused into the ceramic material.

When a content of the pigment in the non-conductive paste is excessively high, a thickness of a pigment layer to be polished and removed is increased, such that a surface roughness may be significantly increased. However, when the content of the pigment is excessively low, a content of the pigment diffused into the electronic component is decreased, such that distinguishability of the marked indication part may be deteriorated. According to the exemplary embodiment in the present disclosure, the (Co,Fe,Mn) (Fe,Mn)$_2$O$_4$ powder may be contained in the non-conductive paste in a content of 35 to 70 wt %, based on a total weight of the non-conductive paste.

In order to implement an excellent printing property, the non-conductive paste may further contain a resin, a dispersant, and a solvent. According to an exemplary embodiment, the non-conductive paste may further contain 3 to 10 wt % of the resin, 1 to 4 wt % of the dispersant, and 25 to 60 wt % of the solvent, based on a total weight of the non-conductive paste, but is not necessarily limited thereto.

In the present disclosure, the specific kinds of resin, dispersant, and solvent are not particularly limited. For example, the resin may be at least one selected from the group consisting of ethyl cellulose (EC), polyvinyl butyral (PVB), rosin and the like, the dispersant may be at least one selected from the group consisting of wetting dispersants such as BYK-220, BYK-103, BYK-160, BYK-142 and the like, and the solvent may be at least one selected from the group consisting of BCA, BCR, DHT, ECA and the like, but the resin, the dispersant, and the solvent are not necessarily limited thereto.

When the non-conductive paste contains glass, the glass contained in the non-conductive paste may move into the body during the sintering, such that the strength of the marking region M may be deteriorated. According to an exemplary embodiment, the non-conductive paste may not contain glass.

As disclosed above, according to exemplary embodiments in the present disclosure, distinguishability of the indication part marked on the surface may be significantly improved, which may improve process efficiency associated with the electronic component.

While exemplary embodiments have been shown and described above, it will be apparent to those skilled in the art that modifications and variations could be made without departing from the scope of the present invention as defined by the appended claims.

What is claimed is:

1. An electronic component comprising:
   a body containing a ceramic material; and
   an indication part formed on a surface of the body and including a base region and a marking region formed of a non-conductive paste on a portion of the base region.

2. The electronic component of claim 1, wherein the ceramic material comprises at least one selected from the group consisting of a BaTi$_4$O$_9$ based ceramic material, a BaTiO$_3$ based ceramic material, a BaTiO$_3$—SrTiO$_3$ based ceramic material, a BaTiO$_3$—PbTiO$_3$ based ceramic material, a BaTiO$_3$—CaTiO$_3$ based ceramic material, a BaTiO$_3$—YTiO$_3$ based ceramic material, a BaTiO$_3$—BaSnO$_3$ based ceramic material, a BaTiO$_3$—BaZrO$_3$ based ceramic material, and a PbTiO$_3$—PbZrO$_3$ based ceramic material.

3. The electronic component of claim 1, wherein the body includes a plurality of coil patterns and electrode patterns, and has a structure in which the plurality of coil patterns and electrode patterns are stacked.

4. The electronic component of claim 1, wherein the body contains a plurality of stacked and sintered ceramic sheets on which the coil pattern is printed and a plurality of stacked and sintered ceramic sheets on which the electrode pattern is printed.

5. The electronic component of claim 4, wherein the body further contains glass.

6. The electronic component of claim 1, wherein the marking region has a color darker than that of the base region.

7. The electronic component of claim 1, wherein the marking region has a black color.

8. The electronic component of claim 1, wherein the non-conductive paste contains a powder comprising one or more selected from the group consisting of (Co,Fe,Mn)(Fe,Mn)$_2$O$_4$, (Co,Fe,Mn)(Fe,Mn,Cr)$_2$O$_4$, (Co,Ni,Fe,Mn)(Fe,Mn,Cr)$_2$O$_4$, (Fe,Cr)$_2$O$_3$, ZnFe$_2$O$_4$, (Ti,Sb,Cr)O$_2$, and CoAl$_2$O$_4$.

9. The electronic component of claim 8, wherein the powder is contained in the non-conductive paste in a content of 35 to 70 wt %, based on a total weight of the non-conductive paste.

10. The electronic component of claim 8, wherein the powder has a Brunauer-Emmett-Teller adsorption model (BET) of 1.4 $m^2/g$ or more.

11. The electronic component of claim 8, wherein the non-conductive paste further contains a resin, a dispersant, and a solvent.

12. The electronic component of claim 8, wherein the non-conductive paste further contains 3 to 10 wt % of a resin, 1 to 4 wt % of a dispersant, and 25 to 60 wt % of a solvent %, based on a total weight of the non-conductive paste.

13. The electronic component of claim 8, wherein the non-conductive paste does not contain glass.

* * * * *